United States Patent [19]

Ichikawa

[11] Patent Number: 5,138,425
[45] Date of Patent: Aug. 11, 1992

[54] SEMICONDUCTOR INTEGRATED CIRCUIT DEVICE WITH NITRIDE BARRIER LAYER ION IMPLANTED WITH RESISTIVITY DECREASING ELEMENTS

[75] Inventor: Matsuo Ichikawa, Suwa, Japan

[73] Assignee: Seiko Epson Corp., Tokyo, Japan

[21] Appl. No.: 755,598

[22] Filed: Sep. 5, 1991

Related U.S. Application Data

[63] Continuation of Ser. No. 527,091, May 22, 1990, abandoned.

[30] Foreign Application Priority Data

May 23, 1989 [JP] Japan .................. 1-129406

[51] Int. Cl.$^5$ ............................................. H01L 29/46
[52] U.S. Cl. ............................................................ 357/67
[58] Field of Search .............................. 357/67, 71, 59

[56] References Cited

U.S. PATENT DOCUMENTS

| | | | |
|---|---|---|---|
| 4,829,363 | 5/1989 | Thomas et al. | 357/67 |
| 4,855,798 | 8/1989 | Imamura et al. | 357/71 |
| 4,887,146 | 12/1989 | Hinode | 357/67 |
| 4,903,096 | 2/1990 | Masuoka et al. | 357/67 |
| 4,935,804 | 6/1990 | Ito et al. | 357/71 |

FOREIGN PATENT DOCUMENTS 57-23423 5/1982 Japan.
60-30107 7/1985 Japan.

OTHER PUBLICATIONS

T. Ohzone et al., "Ion-Implanted Thin Polycrystalline-Silicon High-Value Resistors for High-Density Poly-Load Static RAM Applications", IEEE Trans. on Electron Devices, vol. ED-32(9), pp. 1749-1756, Sep. 1985.

Primary Examiner—Jerome Jackson, Jr.
Attorney, Agent, or Firm—W. Douglas Carothers, Jr.

[57] ABSTRACT

The infiltration of an impurity, such as phosphorus or boron, from a lower layer or interconnect into a higher layer or interconnect can be prevented without sacrificing the established high resistance characteristics of a formed high resistance region in the latter through the employment of a thin nitride film of an appropriate material and thickness positioned at the interface between the lower layer and the high resistance region. This technique minimizes any detrimental shortening of the high resistance region formed in such a layer or interconnect making it suitable for increased density and higher levels of integration of semiconductor devices.

5 Claims, 4 Drawing Sheets

SEMICONDUCTOR INTEGRATED CIRCUIT DEVICE WITH NITRIDE BARRIER LAYER ION IMPLANTED WITH RESISTIVITY DECREASING ELEMENTS

This is a continuation of copending application Ser. No. 07/527,091 filed May 22, 1990 now abandoned.

BACKGROUND OF THE INVENTION

This invention relates generally to semiconductor integrated circuit devices and structures with polycrystal silicon or polycide wiring or interconnects in a lower or bottom layer of the structure and polycrystal silicon interconnects that embody a resistance in an upper layer of the structure and more particularly to the interconnect structure at the contact interface between a lower layer or interconnect and an upper layer or interconnect.

Integrated high resistance formation technology is an important process and technology characteristic in the design and manufacture of SRAM's. The current flowing in a formed high resistance need only be sufficient to compensate for transistor leakage, e.g., one order of magnitude or greater, and any current greater than such amount is unnecessary and only limits the application of the SRAM. Problems that provide limitations on such embodied resistance include: (1) maintenance of high resistance length, (2) polysilicon film thickness, (3) contamination by the impurities and (4) contamination of the passivation film by hydrogen.

Examples of the prior art are shown in FIGS. 3A to 3C and in FIGS. 4A to 4C. As shown in FIG. 3A, a LOCOS oxide film 32 and a gate oxide film 33, portions of which are removed by etching, are formed on a p-type single crystal Si substrate 31. Next, as shown in FIG. 3B, a polycrystal silicon layer is formed and a n+ diffusion is performed on the layer. After performing selective photoetching, the n+ polycrystal silicon interconnect 34 and n+ diffused layer 35 are formed.

As shown in FIG. 3C, ion implantation is performed and n+ diffusion of the source and drain is performed to form n+ diffusion layer 36. On top of that, an interlayer insulating film 37 is formed, a portion of which is removed by photoetching and a polycrystal silicon layer is formed which is partially treated with both ion implantation and photo etching to form the polycrystal silicon low resistance interconnect 39 which includes one or more high resistance regions 38.

In order to lower the wire resistance of resistance region 38 as much as possible, it is treated by ion implantation with large amounts of either arsenic or phosphorous. This technique has, however, two conflicting objectives of lowering the resistance of region 38 on one hand while raising the resistance as much as possible of another region on the other hand. As a result, (1) the polysilicon film thickness cannot be made sufficiently thin, (2) the resistance length of region 38 cannot be made sufficiently long in consideration of registration accuracy and (3) the diffusion of arsenic or phosphorous causes contamination so that resistance values as high as might be expected from the mask dimensions employed cannot in reality be obtained.

The following techniques have been implemented to solve these problems.

As shown in FIG. 4A, a LOCOS oxide film 42 is formed on the p-type single crystal Si substrate, and a gate oxide film 43 on substrate 41 is formed, a portion of which is removed by etching. As shown in FIG. 4B, a polycrystal silicon layer is formed after which a n+ diffusion and selective photoetching are performed to form the n+ polycrystal silicon interconnects 44 and n+ diffusion layer 45.

As illustrated in FIG. 4C, ion implantation is performed and n+ diffusion of the source and drain is performed to form the n+ diffusion layer 46. An interlayer insulation layer 47 is formed on top of layer 46, a portion of which is removed by etching. Next, a polycrystal silicon layer 50 is formed on top of layer 47 which is photoetched to form high resistance region 48. However, the heat produced during formation of polycrystal silicon layer 49 and in subsequent processing steps causes the phosphorus to infiltrate upwardly from lower layer polycrystal silicon interconnects 44 to form the n+ diffusion regions 49 in layer 50.

In this technique illustrated in FIG. 4, the high resistance polysilicon can, in principle, be made as thin as possible and no registration margin is required, so a longer high resistance length can be achieved compared to the case of the former technique of FIG. 3. However, even in the case of the technique of FIG. 4, phosphorus infiltrates from lower layer polysilicon interconnects 44 due to the heat, thus affecting or otherwise shortening the high resistance length. As memory densities on single chips have increased and the levels of integration and density have progressed with the state of the art, this phosphorus infiltration has become a serious problem in obtaining desired high resistance values.

It is an object of the present invention to prevent the infiltration of phosphorus from the lower layer polysilicon interconnect into a high resistance region in an upper or approximately located polysilicon interconnect to maintain the predesigned high resistance length of the high resistance region in the interconnect and thereby yielding an interconnect high resistance region capable of withstanding higher densities and higher levels of integration than presently possible in the prior art.

SUMMARY OF THE INVENTION

According to this invention, the detrimental infiltration of phosphorus, for example, to upper regions of a semiconductor device or structure from a lower layer interconnect is prevented without sacrificing the high resistance characteristic required and designed in an upper layer interconnect by employing a nitride film of appropriate material and thickness at the contact interface between the lower layer interconnect and such upper regions.

By means of the technique of this invention, the infiltration of an impurity, such as phosphorus or boron, from a lower layer or interconnect into a higher layer or interconnect can be prevented without sacrificing the established high resistance characteristics of a formed high resistance region in the latter through the employment of a thin film of an appropriate material and thickness positioned at the interface between the lower layer and the high resistance region. This technique minimizes any detrimental shortening of the high resistance region formed in such a layer or interconnect making it suitable for increased density and higher levels of integration of semiconductor devices.

The lower layer interconnect may also be comprised of polycide and the nitride film formed during nitridation may be different depending on the material. The nitride film may be $Si_3N_4$ or other nitride films, such as, TiN, WN, MoN, CN, etc.

Other objects and attainments together with a fuller understanding of the invention will become apparent and appreciated by referring to the following description and claims taken in conjunction with the accompanying drawings.

DESCRIPTION OF THE PREFERRED EMBODIMENTS

Figure 1A:
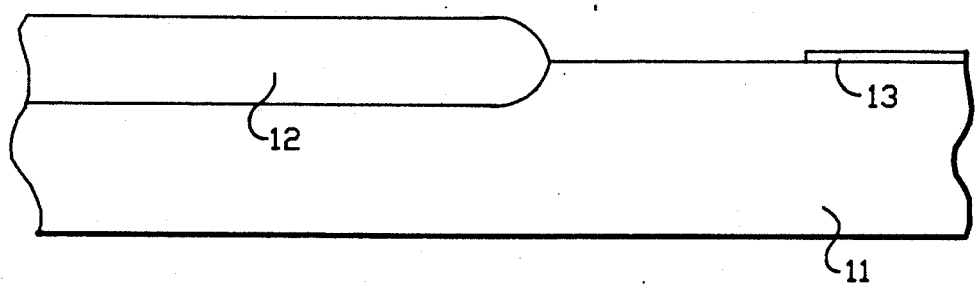
FIGS. 1A-1C are a sequence of cross sectional side elevations illustrating one embodiment of this invention.

Reference is now made to FIGS. 1A through 1C and FIGS. 2A through 2C. As shown in FIG. 1A, a LOCOS oxide film 12 having a thickness in the range of 4000 Å to 8000 Å and a gate oxide film 13 having a thickness in the range of 100 Å to 250 Å are formed on the top surface of a p-type single crystal Si substrate 11. A portion of gate oxide film 13 is removed by photoetching to expose Si substrate 11.

Figure 1B:
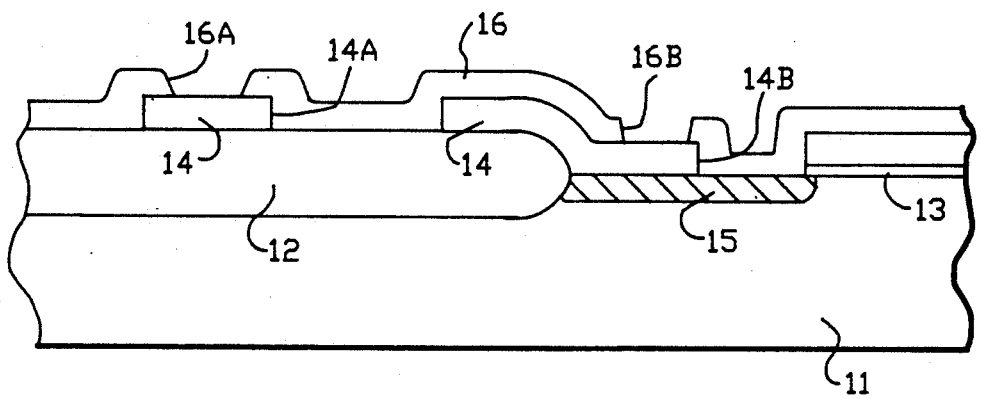
Figure 1C:
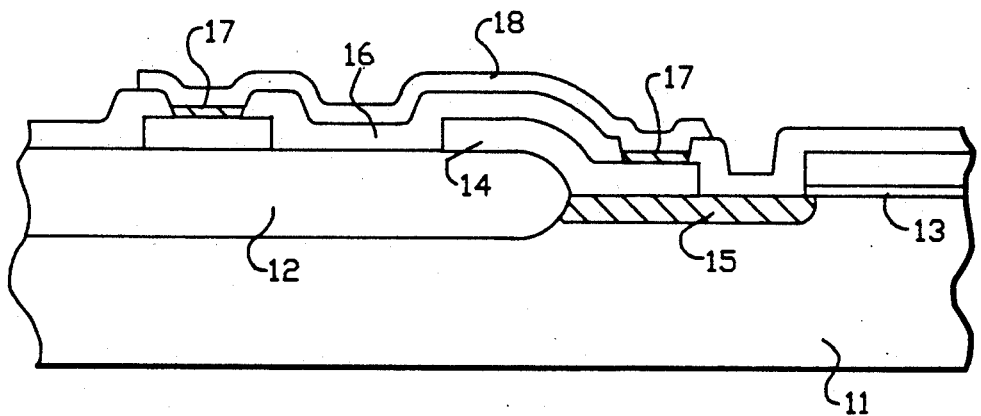

As shown in FIG. 1B, a polycrystal silicon film having a thickness in the range of 3000 Å to 4500 Å is formed, after which it is n+ doped by thermal diffusion forming polycrystal silicon interconnect 14. Next, after light oxidation, ion implantation is performed using P+ ions at 35 keV to 60 keV with a concentration of $1 \times 10^{15}/cm^2$ to $5 \times 10^{16}/cm^2$ to form n+ diffusion layer 15. Interconnect 14 is then patterned employing photoetching as indicated at 14A and 14B. Following light oxidation, a CVD $SiO_2$ film 16 is formed having a thickness in the range of 1500 Å to 3500 Å. Selective portions of film 16 are removed by photoetching to form contact holes 16A and 16B for connection. Next, as illustrated in FIG. 1C, the structure is heated to 900° C. to 1100° C. in a nitrogen or gaseous ammonia atmosphere wherein the exposed surface of polycrystal silicon interconnect 14 undergoes thermal nitridation. As a result, a nitride film 17 having a thickness in the range of 50 Å to 150 Å is formed by nitridation in a nitrogen or gaseous ammonia plasma. Film 17 may also be comprised of $Si_3N_4$, TiN, WN, MoN, or CN.

Next, ion implantation is performed employing B+ ions, P+ ions or the ions of a high melting point metal at 35 keV to 150 keV with a concentration in the range of $5 \times 10^3/cm^2$ to $5 \times 10^{16}/cm^2$ in order to obtain a suitable conductivity level in film 17. Next, a high resistance polycrystal silicon layer having a thickness in the range of 1000 Å to 2500 Å and forming having a high resistance region 18 wherein a portion of this layer is removed by photoetching. As long as the resistance value of nitride film 17 is lower than that of high resistance region 18, the resistance value of nitride film 17 is not limited. The final semiconductor integrated device is achieved after several subsequent processing steps as is known in the art.

Figure 2A:
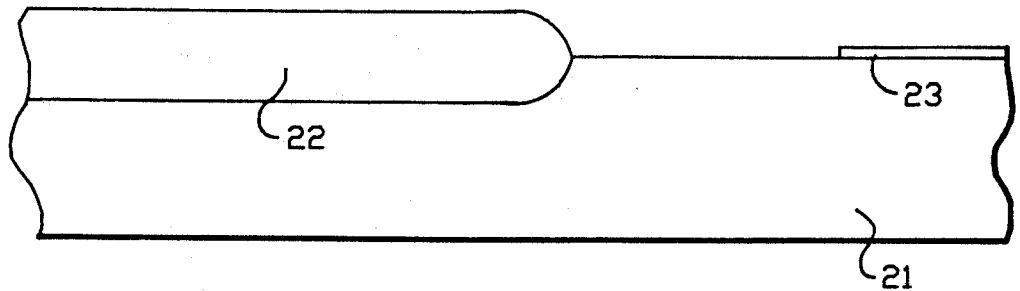
FIGS. 2A-2C are a sequence of cross sectional side elevations illustrating another embodiment of this invention.

As shown in FIG. 2A, a LOCOS oxide film 22 having a thickness in the range of 4000 Å to 8000 Å and a gate oxide film 23 having a thickness in the range of 100 Å to 250 Å are formed on the top surface of a p-type single crystal Si substrate 21. A portion of gate oxide film 23 is removed by photoetching to expose Si substrate 21.

Figure 2B:
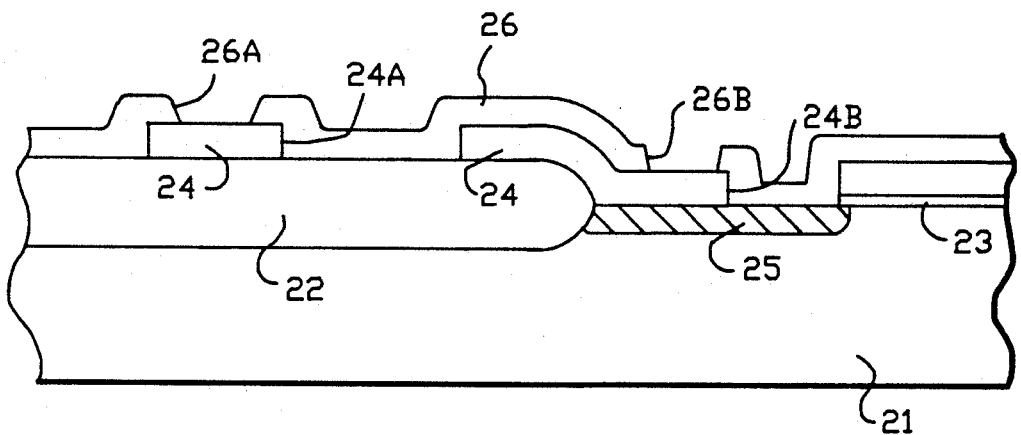
Figure 2C:
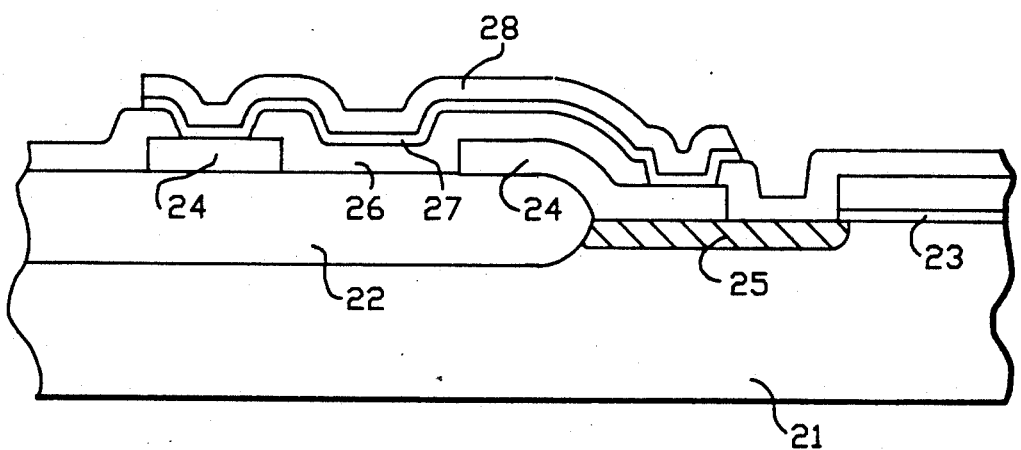
Figure 3A:
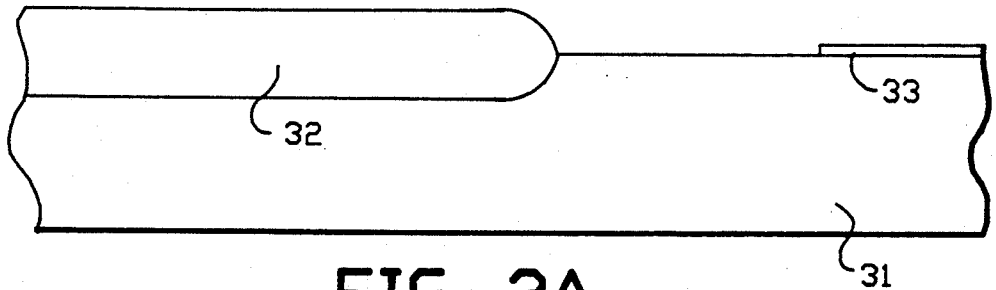
FIGS. 3A-3C are a sequence of cross sectional side elevations illustrating one embodiment known in the prior art.
Figure 3B:
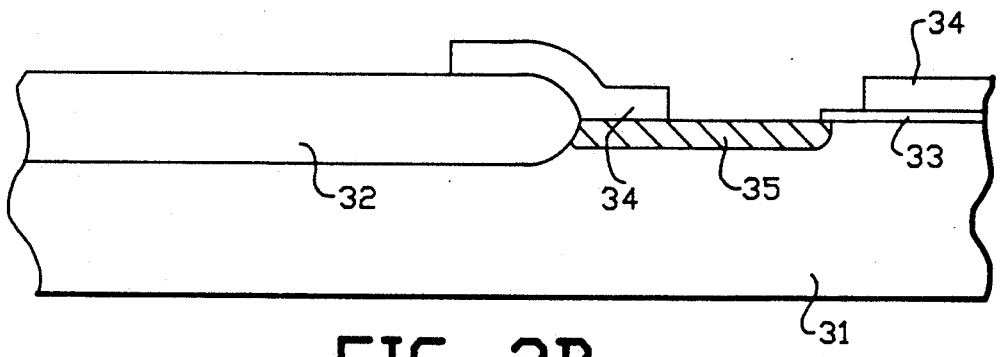
Figure 3C:
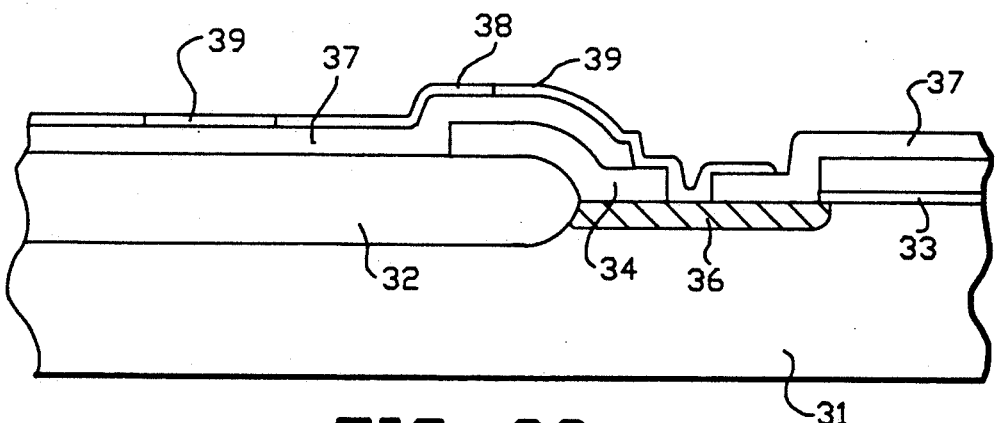
Figure 4A:
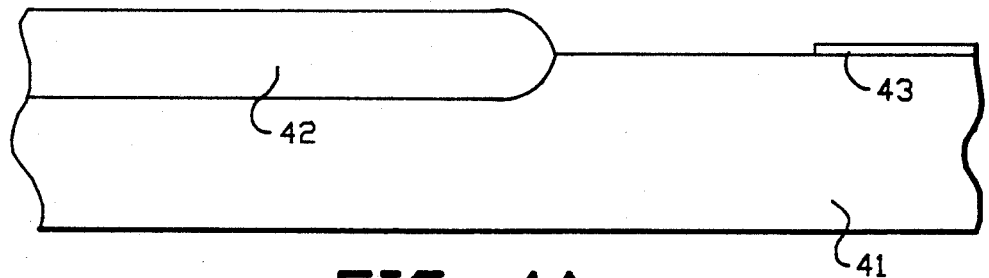
FIGS. 4A-4C are a sequence of cross sectional side elevations illustrating another embodiment known in the prior art.
Figure 4B:
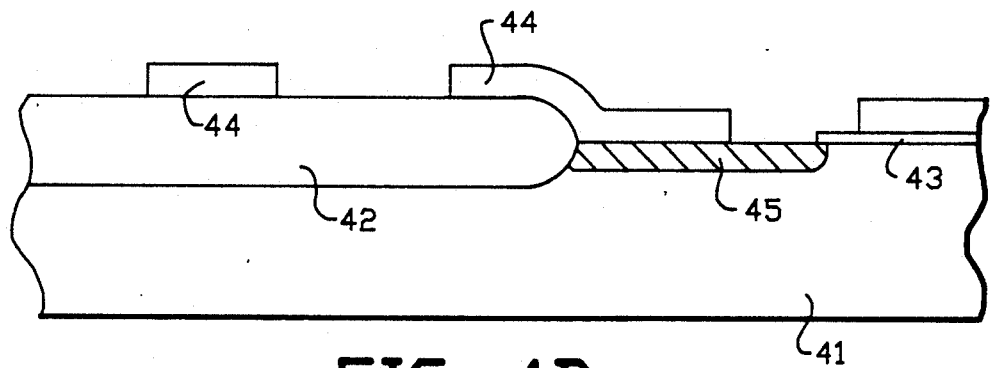
Figure 4C:
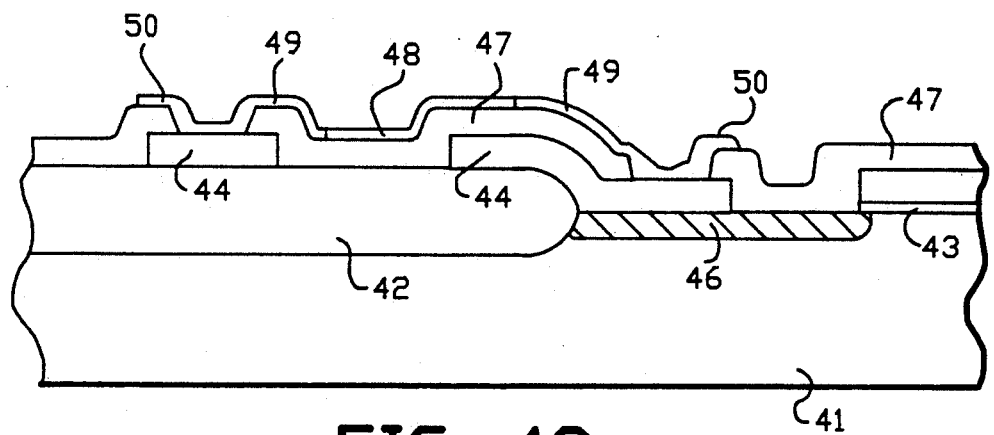

As shown in FIG. 2B, a polycrystal silicon film having a thickness in the range of 3000 Å to 4500 Å is formed, after which it is n+ doped by thermal diffusion forming polycrystal silicon interconnect 24. Next, after light oxidation, ion implantation is performed using P+ ions at 35 keV to 60 keV with a concentration of $1 \times 10^{15}/cm^2$ to $5 \times 10^{16}/cm^2$ to form n+ diffusion layer 25. Interconnect 24 is then patterned employing photoetching as indicated at 24A and 24B. Following light oxidation, a CVD $SiO_2$ film 26 is formed having a thickness in the range of 1500 Å to 3500 Å. Selective portions of film 16 are removed by photoetching to form contact holes 26A and 26B for connection. Next, as illustrated in FIG. 2C, a nitride film 27 having a thickness in the range of 50 Å to 300 Å is formed employing CVD. Film 27 may be $Si_3N_4$, TiN, WN, MoN, CN, etc. Also, at this time, another high melting point metal may be combined in this nitridation process or the ratio of silicon atoms in the nitride deposition process may be increased.

Next, an ion implantation is performed employing B+ ions, P+ ions or the ions of a high melting point metal, e.g., Mo, W, Cr, Ni, Cu, etc., is performed at 35 keV to 150 keV with a concentration in the range of $5 \times 10^{13}/cm^2$ to $5 \times 10^{16}/cm^2$ in order to obtain a suitable conductivity level in film 27. Next, a polycrystal silicon layer having a thickness in the range of 1000 Å to 2500 Å forming the high resistance region 28 wherein a portion of this layer is removed by photoetching. As long as the resistance value of nitride film 27 is lower than that of high resistance region 28, the resistance value of nitride film 27 is not limited. The final semiconductor integrated device is achieved after several subsequent processing steps as is known in the art.

While the invention has been described in conjunction with several specific embodiments, it is evident to those skilled in the art that many further alternatives, modifications and variations will be apparent in light of the forgoing description. Thus, the invention described herein is intended to embrace at such alternatives, modifications, applications and variations as fall within the spirit and scope of the appended claims.

What is claimed is:

1. A semiconductor circuit device comprising
   a first polycrystalline silicon or polycide interconnect formed on a top surface of an impurity diffused region formed in a Si single crystal substrate or over an insulating film,
   an intermediate insulating film formed over said first interconnect,
   a second polycrystal silicon interconnect having at least, in part, a high resistance region of first resistance value therealong and connected to said first interconnect through at least one contact hole in said intermediate insulating film,
   a nitride film having a thickness in the range of 50 Å to 300 Å formed at the contact interface between said first interconnect and said second interconnect,
   said nitride film selected from the group consisting of $Si_3N_4$, TiN, WN, MoN and CN,
   an impurity implanted at 35 keV to 150 keV with a concentration in the range of $5 \times 10^{13}/cm^2$ to $5 \times 10^{16}/cm^2$ to provide said nitride film with a second resistance value, said impurity selected from the group consisting of B, P, Mo, W, Cr, Ni and Cu, said second resistance value being lower than the first resistance value of said high resistance region, said nitride film preventing the infiltration of impurity from said diffusion region into said high resistance region decreasing said first resistance value.

2. The semiconductor integrated circuit of claim 1 wherein said nitride film is formed on the surfaces of said first interconnect by thermal nitridation.

3. The semiconductor integrated circuit of claim 2 wherein said nitride film is impregnated with a large percentage of silicon and includes at least one metal having a high melting point.

4. The semiconductor integrated circuit of claim 3 wherein the composition ratio of silicon in said nitride film is higher than the nitride compounds or components in said nitride film.

5. The semiconductor integrated circuit of claim 1 wherein said first polycrystalline silicon is an $n^+$ doped polysilicon

* * * * *